United States Patent [19]
van Ommen et al.

[11] Patent Number: 4,925,805
[45] Date of Patent: May 15, 1990

[54] METHOD OF MANUFACTURING A SEMICONDUCTOR DEVICE HAVING AN SOI STRUCTURE USING SELECTABLE ETCHING

[75] Inventors: Alfred H. van Ommen; Johanna M. L. Mulder; Johannes F. C. M. Verhoeven, all of Eindhoven, Netherlands

[73] Assignee: U.S. Philips Corporation, New York, N.Y.

[21] Appl. No.: 333,062

[22] Filed: Apr. 3, 1989

[30] Foreign Application Priority Data

Apr. 5, 1988 [NL] Netherlands .................. 8800847

[51] Int. Cl.$^5$ .............................. H01L 21/76
[52] U.S. Cl. ...................... 437/21; 437/24; 437/67; 437/927; 437/65
[58] Field of Search .................. 437/21, 24, 26, 67, 437/927, 65, 64; 156/628, 644

[56] References Cited

U.S. PATENT DOCUMENTS

| | | | |
|---|---|---|---|
| 4,264,382 | 4/1981 | Anantha et al. | 437/67 |
| 4,333,227 | 6/1982 | Horng et al. | 437/67 |

FOREIGN PATENT DOCUMENTS

| | | | |
|---|---|---|---|
| 0223694 | 5/1987 | European Pat. Off. | 437/67 |
| 58-121642 | 7/1983 | Japan | 437/67 |
| 58-169934 | 10/1983 | Japan | 437/67 |
| 63-114158 | 5/1988 | Japan | 437/67 |

OTHER PUBLICATIONS

Blum et al., IBM Tech. Discl. Bull., vol. 21, No. 9 (Feb. 1979), pp. 3814–3817.

*Primary Examiner*—Olik Chaudhuri
*Attorney, Agent, or Firm*—Paul R. Miller

[57] ABSTRACT

The invention relates to a method of manufacturing a semiconductor device comprising a semiconductor body (1) having a buried insulating layer (7). Such a type of semiconductor device is known as a device of the SOI type. According to the invention, the starting material is a substrate (1) of monocrystalline semiconductor material with a top layer (2). Ions are implanted into a zone located under the top layer so that the zone becomes selectively etchable with respect to the remaining part of the substrate. The zone is then etched away, a cavity then being formed between the top layer (2) and the remaining part of the substrate (1). The cavity is filled at least in part with insulating material (7). By known techniques, semiconductor circuit elements can be provided in the top layer (2) thus disposed on the insulating layer (7).

14 Claims, 4 Drawing Sheets

METHOD OF MANUFACTURING A SEMICONDUCTOR DEVICE HAVING AN SOI STRUCTURE USING SELECTABLE ETCHING

FIELD OF THE INVENTION

The invention relates to a method of manufacturing a semiconductor device comprising a semiconductor body having a buried insulating layer, in which the starting material is a substrate, at least part of which consists of monocrystalline semiconductor material, under a top layer of which the buried insulating layer is formed using ion implantation.

A number of semiconductor circuit elements can be provided in the top layer of the semiconductor body. Such a type of semiconductor device is especially known as SOI (Silicon On Insulator) device, in which a top layer of monocrystalline silicon is disposed on a buried layer of silicon oxide. In recent years, such semiconductor devices have become increasingly interesting because of many advantages associated with their specific structure. These advantages are inter alia a high operating speed, a good radiation hardness and elimination of mutual influencing, such as, for example, latch-up of circuit elements provided in the top layer.

BACKGROUND ART

A method of the kind mentioned in the opening paragraph is known from European Patent Application No. 164,281, corresponding to U.S. Pat. No. 4,704,302. In the method described therein, the starting material is a substrate of monocrystalline silicon. Oxygen or nitrogen ions are implanted under a top layer of the substrate. The ions react at this area with the silicon present, as a result of which the latter is converted into silicon oxide and silicon nitride, respectively. Ultimately, the semiconductor body has under the top layer a buried layer of silicon oxide and silicon nitride, respectively.

A disadvantage of the known method described is that, in order to form a good insulating buried layer, in this method the oxygen or nitrogen ions must be implanted at a high dose. In this Patent Application, a dose of $10^{18}$ to $3 \times 10^{18}$ ions/cm² is mentioned. As a result, the implantation is of long duration and very expensive and a comparatively large number of lattice defects and stresses are produced in the top layer.

SUMMARY OF THE INVENTION

The invention has inter alia for its object to provide a method of the kind mentioned in the opening paragraph, in which the implantation can be carried out at a lower dose.

For this reason, according to the invention a method of the kind mentioned in the opening paragraph is characterized in that ions are implanted under the top layer into a zone of the substrate, thus including lattice defects into the semiconductor material of the zone, as a result of which the zone becomes selectively etchable with respect to the remaining part of the substrate, after which the zone is etched away, a cavity then being formed between the top layer and the remaining part of the substrate, after which the cavity is filled up at least in part with insulating material. It has been found that, in order to obtain such a selective etchability, a dose suffices which is 1000 times lower than that required to convert the semiconductor material of the zone into oxide or nitride. Experiments with a semiconductor substrate of silicon further have shown that, in order to obtain the desired selective etchability, ions of a large number of elements, for example hydrogen, oxygen, nitrogen, silicon, germanium, boron, phosphorus, arsenic and the rare gases, can be implanted. By the implantation, such a large number of lattice defects are formed in the monocrystalline silicon that the silicon locally rather has the character of amorphous silicon. This disturbed silicon can be etched at a much higher rate than the monocrystalline silicon of the remaining part of the substrate. The zone can thus be removed selectively.

As has already been stated above, according to the invention the zone is etched away selectively with respect to the top layer. This means that it must be possible for an etchant to reach the zone. Sometimes this can be realized at a side face of the substrate. If etching from a side face can be effected only with difficulty, according to the invention the top layer is provided with an opening, through which the zone is exposed, so that it is possible for an etchant to reach the zone. Preferably, for this purpose the substrate is covered with an etching mask, whereupon the opening is etched anisotropically into the top layer.

It is also possible to locally implant ions into the top layer so that lattice defects are also produced in a part of the top layer, as a result of which this part becomes selectively etchable with respect to the remaining part of the top layer and can be selectively etched away to form the opening.

In order to reduce the possibility that the top layer becomes detached from the remaining part of the substrate, if the zone extends throughout the surface of the substrate, care should be taken during etching that not the entire zone is etched away. A particular embodiment of the method according to the invention is characterized in that, before the ion implantation is carried out, a part of the substrate is covered with an implantation mask. As a result, the ions are not implanted over the whole surface of the substrate under the top layer into the substrate, but the implanted zone is interrupted by the masked part, which is free from implanted ions. This part can then serve as an etch stopper. The masked part can moreover be used in the ultimate semiconductor device as a substrate connection. Also for this purpose it is desirable that this part is as free as possible from undesired impurities.

A further embodiment of the method according to the invention is characterized in that at the area of the masked part a pit is formed in the top layer and extends under the substrate into the substrate, whereupon the pit is filled with insulating material. Although in other embodiments use was made of a connection of semiconductor material between the top layer and the remaining part of the substrate, in this embodiment the top layer is disposed throughout its surface on an insulating underlying layer. Though this is to be preferred in many cases, the insulating material need not be of the same kind as the dielectric material with which the cavity between the top layer and the remaining part of the substrate is filled up.

As already stated, ions of a large number of elements can be used for the implantation. Preferably, however, ions are implanted which are electrically inert with respect to the material of the top layer. Accordingly a particular embodiment of the method according to the invention is characterized, in that the starting material is a substrate of silicon and in that ions of one of the elements from the group IV of the Periodical System and more particularly silicon ions are implanted into the zone. These elements all have at least a similar electron configuration as silicon so that, when ions are trapped by the top layer, this does not result in that additional charge carriers are added to the top layer. Thereby, silicon atoms have the further advantage that they are not of the same size as the atoms of the substrate.

Preferably, the substrate is cooled during the implantation. Consequently, it is avoided that semiconductor atoms once pushed out of their position can diffuse back to their original place.

The cavity can be completely filled up with insulating material, such as, for example, silicon nitride or silicon oxide. According to the invention, this material can then be deposited from the vapour phase in the cavity. A preferred embodiment of the method according to the invention is characterized, however, in that the inner wall of the cavity is covered with a comparatively thin dielectric layer, whereupon the cavity is filled up further with semiconductor material of the same kind as that of the substrate. The dielectric layer may be provided, for example, according to the invention in that the inner wall of the cavity is exposed to an oxidizing medium. Due to the fact that the cavity is thus filled up for the major part with the same material as the substrate, the properties of the filling of the cavity are substantially equal to those of the substrate so that the occurrence of stresses, for example due to a difference between the thermal expansion coefficients of the substrate and the filling material, is avoided at least to a considerable extent. The dielectric layer with which the inner wall of the cavity is covered provides for the insulation aimed at.

The invention will now be described more fully with reference to a drawing and a few embodiments.

DETAILED DESCRIPTION OF THE INVENTION

Figure 1:
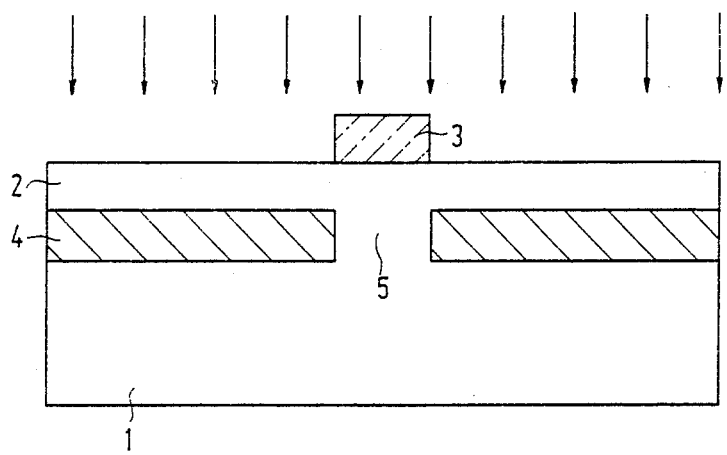
FIGS. 1 to 3 show diagrammatically in cross-section successive stages in the manufacture of the semiconductor device according to a first embodiment of the method in accordance with the invention.

The Figures are schematic and not drawn to scale. For the sake of clarity, especially certain dimensions are greatly exaggerated. Corresponding parts are generally designated by the same reference numerals. Further, semiconductor materials of the same conductivity type are generally cross-hatched in cross-section in the same direction.

Figure 2:
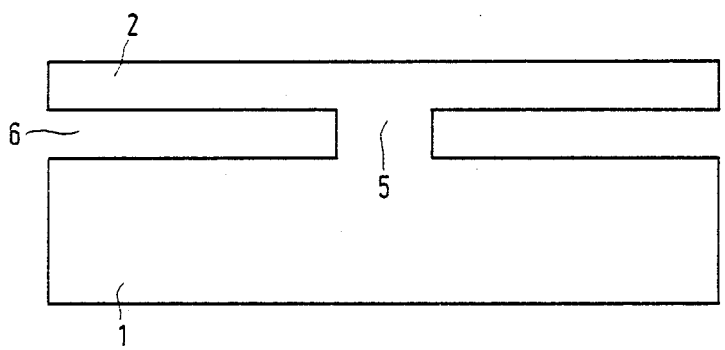
Figure 3:
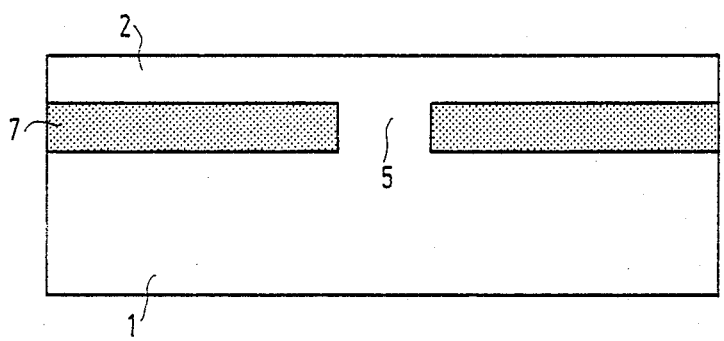

FIGS. 1 to 3 show a first embodiment of the method according to the invention, in which a buried insulating layer 7 is formed under a top layer 2 of a substrate 1 (see FIG. 3). The starting material (FIG. 1) is a substrate 1 of monocrystalline semiconductor material, which in this embodiment is silicon. On the substrate 1 is provided a masking layer 3, which locally covers the substrate 1. Subsequently, the assembly is exposed to an ion implantation. During the ion exposure, the masking layer 3 masks against implantation, as a result of which a masked part 5 of the semiconductor substrate 1 remains free from implanted ions. Although ions of substantially all elements can be used for the implantation, ions are preferably implanted which are electrically inert with respect to the silicon substrate, such as, for example, ions of rare gases or of elements from group IV of the periodical System. In this embodiment, use is made of silicon ions because besides in electrical respect they do not deviate from the material of the substrate with regard to their size. The implantation is carried out in this embodiment at an energy of about 600 keV and a dose of $3 \times 10^{15}$ cm$^{-2}$. This energy is sufficient for the ions to penetrate into the substrate 1 under an about 0.5 $\mu$m thick top layer 2. As a result, an about 0.5 $\mu$m wide zone 4 under the top layer 2 becomes selectively etchable with respect to the remaining part of the substrate. During the implantation, the temperature of the substrate is kept practically at room temperature by cooling the substrate. Experiments have shown that, when the substrate is cooled during the implantation, a higher selective etchability of the zone with respect to the remaining part of the substrate is attained. It is presumed that by the implantation into the zone 4 the silicon atoms are pushed out of their lattice positions, so that the monocrystalline silicon of the zone 4 is converted into amorphous silicon, which is selectively etchable with respect to monocrystalline silicon. When during the implantation the substrate is not cooled, the temperature thereof will increase. Under the influence of the increased temperature, many silicon which are pushed out of their position by the implantation will be driven back to their original position in the lattice. Thus, the envisioned change of the crystal structure is counteracted.

After the implantation, the masking layer 3 is removed and the assembly is subjected to an etching treatment with a suitable etchant. During this etching treatment, the zone 4 is etched away so that a cavity 6 is formed between the top layer 2 and the remaining part of the substrate 1 (FIG. 2). In this embodiment, use is made of a 25% buffered solution of hydrofluoride, with which an etching rate can be attained of about 0.1 $\mu$m/hour. Thus, a selective etchability of the zone 4 with respect to the remaining part of the substrate 1 is obtained, which is substantially 1000:1. When an etchant of higher etching rate is desired, use can be made of phosphoric acid at a temperature of about 150°-200° C., with which an etching rate of about 4 $\mu$m/hour is attainable. In this case, however, the selectivity is slightly lower than in the case of the first etchant. This has the advantage that the cavity ultimately formed will taper slightly from the outside towards the etch stopper. Especially when in a later processing step material, for example silicon oxide or nitride, is deposited in the cavity from the vapour phase (chemical vapour deposition), the tapering form facilitates a complete filling of the cavity. The time duration of the etching treatment is not very critical due to the fact that the masked part 5 acts as an etch stopper. Moreover, it is possible to etch into the substrate cavities of different lengths. When in a short cavity the etchant has reached the etch stopper, the etching process stops there, while in longer cavities the etching process can be continued. Thus, islands of monocrystalline semiconductor material of different size can be formed in the ultimate semiconductor device.

Subsequently, in this embodiment, the cavity 6 is completely filled up with an insulating material by depositing in the cavity silicon oxide from the vapour phase. In this embodiment, the silicon oxide is deposited in the cavity by chemical vapour deposition (CVD) of tetraethyl orthosilicate (TEOS). Another suitable insulating material is silicon nitride, which can be deposited in a similar manner. Thus, the configuration of FIG. 3 is obtained, in which the insulating layer 7 of silicon oxide is buried under the top layer 2 of monocrystalline silicon. Such a structure is generally designated as an SOI structure. In the top layer, semiconductor circuit elements can be provided in a known manner to form an integrated circuit with the aforementioned advantages inherent in this structure.

Figure 4:
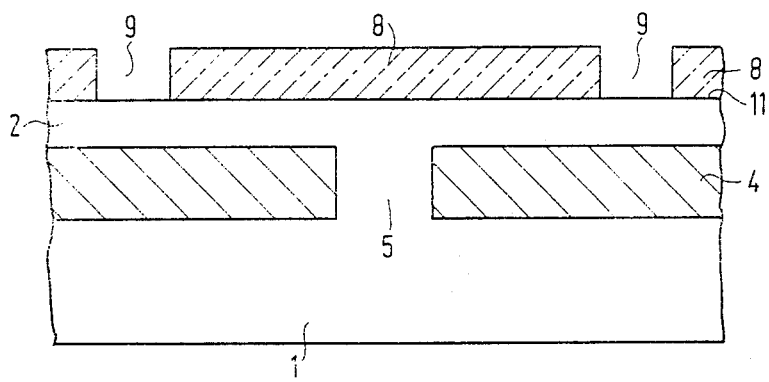
FIGS. 4 to 8 show diagrammagically in cross-section and in plan view successive stages in the manufacture of the semiconductor device according to a second embodiment of the method in accordance with the invention.
Figure 5:
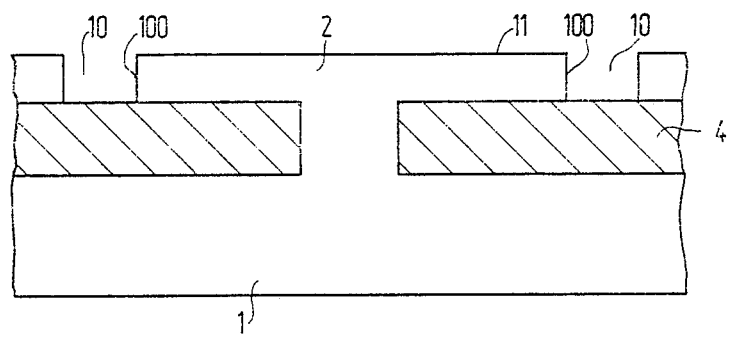

In the embodiment of the method described, the etchant can reach the zone from a side face of the substrate, However, if it is difficult to etch from a side face, according to the invention, an opening 10 is provided in the top layer 2 so that the etchant can reach the zone 4. For this purpose, for example, the starting material is the structure shown in FIG. 1. After the masking layer 3 has been removed, the top layer 2 is covered with an etching mask 8, which is provided above the zone 4 with an opening 9see (FIG. 4). Subsequently, the assembly is subjected to a suitable etchant, as a result of which an opening 10 is etched into the top layer 2 at the area of the opening 9 (FIG. 5). For this purpose, in this embodiment, the assembly is exposed to a chlorine- or fluorine-containing plasma, with which the opening 10 is etched anisotropically into the top layer 2. In this case, the opening 10 is obtained with practically vertical walls and the opening 10 ultimately formed has practically the same size as the opening 9 in the etching mask 8. Within the scope of the invention, however, an isotropic etchant, such as, for example, a mixture of hydrofluoride and niric acid, may also be used. However, if the opening 9 is etched isotropically into the top layer 2, the top layer will be slightly etched also beneath the etching mask 8. The ultimate opening 10 in the top layer 2 will then be slightly larger than the opening 9 in the etching mask.

After the structure of FIG. 1 has been obtained, also a second implantation can be carried out, by which the top layer 2 becomes selectively etchable with respect to the remaining part of the top layer at the area of the opening 10 to be formed. The second implantation may be carried out, for example, with silicon ions at an energy of 200 keV. If the assembly is then exposed to hot phosphoric acid at a temperature of about 160° C., both the opening 10 and the cavity 6 can be formed in a single etching step.

Figure 6:
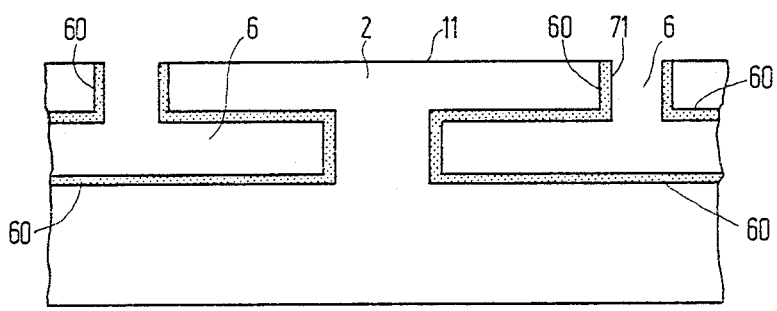
Figure 7:
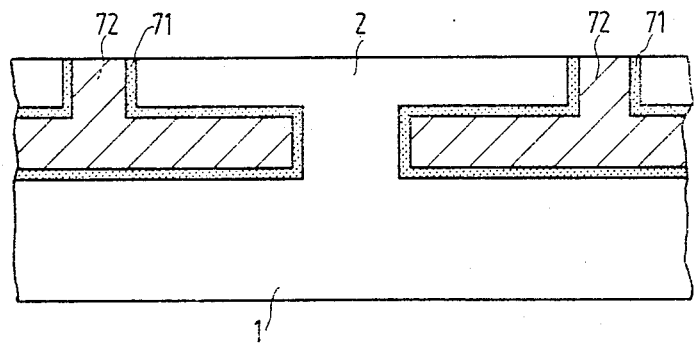
Figure 8:
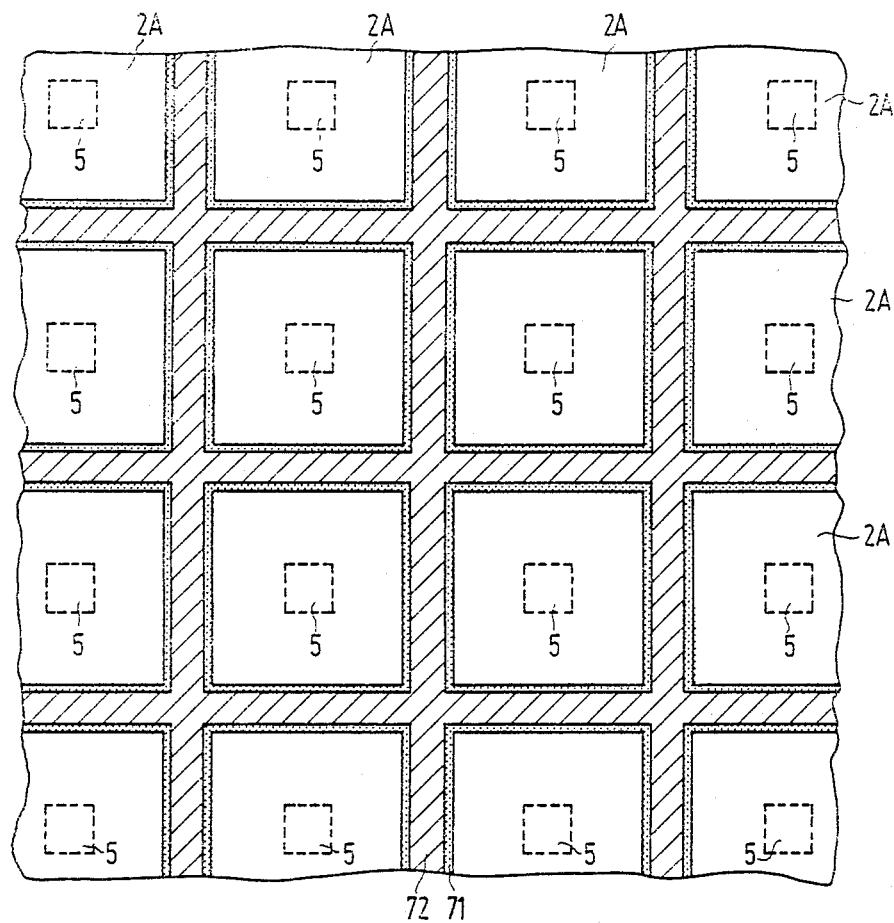

After the opening 10 has been provided in the top layer 2 and an etchant can reach the zone 4, in the manner described above the zone 4 can be selectively etched away with respect to the remaining part of the substrate. In this embodiment, according to the invention the inner wall 60 of the cavity 6 formed is then covered with a comparatively thin dielectric layer 71, in this embodiment of silicon oxide (FIG. 6). For this purpose, the inner wall 60 of the cavity 6 is exposed for 10 to 20 minutes to an oxidizing medium of oxygen and HCL at a temperature of about 900° C. so that a thin silicon oxide layer 71 is grown on the inner wall 60. During this oxidation, if desired, the surface 11 of the substrate 1 may be protected from oxidation by covering it beforehand with an oxidation mask. Subsequently, according to the invention, the cavity 6 is further filled up with semiconductor material of the same kind as that of the substrate, in this case silicon. For this purpose, for example, polycrystalline silicon 72 is deposited from the vapour phase in the cavity. Due to the fact that thus the cavity is filled up for the major part with silicon, the cavity filling 71, 72 has practically the same properties as the substrate 1 itself so that the occurrance of stresses, for example due to a difference between the thermal expansion coefficients of the substrate 1 and the filling material 71, 72, is avoided at least to a considerable extent. The dielectric layer 71 with which the inner wall 60 of the cavity is covered provides for the electrical insulation aimed at of the top layer from the remaining part of the substrate. The ultimate structure is shown diagrammatically in FIG. 7. Preferably, the opening 10 is formed so that it encloses completely an island-shaped part 2A of the top layer 2. After the cavity 6 and the opening 10 have been filled up with the insulating material, the island-shaped part 2A is bounded both on the lower side by the buried insulating layer 7 and laterally by dielectric material. As a result, a mutual influencing of semiconductor circuit elements provided ultimately in the separate islands 2A is avoided or counteracted at least to a considerably extent. This structure is shown diagrammatically in plan view in FIG. 8 for a number of islands 2A. Herein the dotted line indicates in perpendicular projection the boundary against the masked parts of the buried insulating layer 71, 72.

Figure 9:
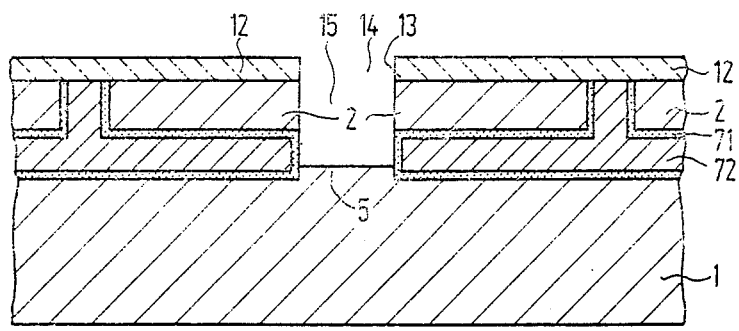
FIGS. 9 to 11 show diagrammatically in cross-section successive stages in the manufacture of the semiconductor device according to a further embodiment of the method in accordance with the invention.
Figure 10:
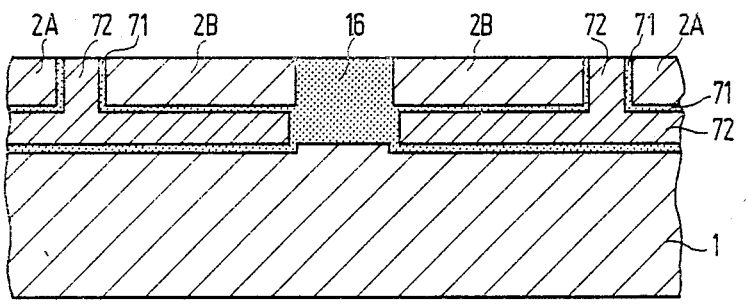
Figure 11:
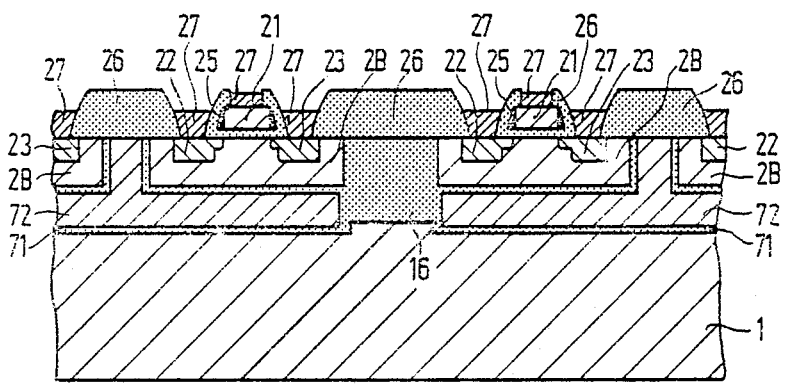

In the preceding embodiments of the method, the selectively etchable zone 4 is invariably formed while masking the masking layer 3. As a result, the masked part 5 remains free from ions, as a result of which this part can act as an etch stopper. However, this also results in that the buried insulating layer ultimately formed is interrupted by the part 5 of semiconductor material. In certain applications, this fact can be utilized with advantage, for example on behalf of a substrate connection of a semiconductor device provided in the top layer 2. In other cases, a structure may be desirable in which the top layer 2 is disposed on a continuous buried insulating layer 7. According to the invention this may be achieved, for example, starting from the configuration of FIG. 7, in the following manner:

After the cavity 6 has been filled up with silicon oxide, an etching mask 12 having an opening 14 at the area of the masked part 5 is provided on the assembly. The assembly is then exposed to a chlorine- or fluorine-containing plasma, with which a pit 15 is etched at the area of the opening 14 into the top layer 2, which pit extends under the top layer 2 into the substrate 1 (FIG. 9). This masking and etching step is not very critical due to the fact that the edge 13 of the mask 12 may project beyond the buried layer 71, 72 and the pit 15 may also extend over a larger or smaller distance under the top layer 2. Subsequently, the pit 15 is filled with insulating material 16, for example silicon oxide. The structure obtained is shown in FIG. 10. In the case of a number of islands 2A, as shown, for example, in FIG. 8, the pit 15 can take the form of a slot extending through a number of masked parts 5 of the islands 2A. When the pit 15 has been filled up, in the substrate, islands 2B of semiconductor material are formed, which are fully insulated from the substrate. For example, one or more transistors may be provided in each island 2B by known techniques. FIG. 11 shows in cross-section, by way of example a semiconductor device manufactured by means of the method according to the invention, in which a MOS field effect transistor is provided in each island 2B. The MOS transistors can be provided by known techniques. The island 2B is n-doped, for example, with arsenic. Subsequently, the island is covered by thermal oxidation with a layer of gate oxide 20. An about 0.3 μm thick polycrystalline silicon layer is provided on the assembly and a gate electrode 21 is formed from this layer by masking and etching. While masking the gate electrode 21, an n-type dopant is implanted into the island 2B at a low dose. After a comparatively thick silicon nitride layer has been deposited from the vapour phase on the assembly and an edge portion 25 has been formed therefrom around the gate electrode 21 by anisotropic etching, for example sputter etching, a second implantation is carried out at a higher dose, in which both the gate electrode 21 and the edge portion 25 mask. Due to this double implantation, n-type source and drain zones 22, 23 are formed in the island 2B having a comparatively highly doped part and a comparatively weakly doped part, the weakly doped parts adjoining the channel region 24 located between the source and drain zones 22, 23. The assembly is then covered with a layer of silicon oxide 26, in which contact openings are provided, which are filled up with a suitable metallization 27 to contaact the source and drain zones 22, 23 and the gate electrode 21.

It should further be noted that the method according to the invention is not limited to the embodiments described above. Many further variations are possible within the scope of the invention for those skilled in the art. In the embodiment described above, the island is provided with an n-channel field effect transistor. However, by means of the method according to the invention, a semiconductor device may also be manufactured comprising p-channel field effect transistors. Moreover, by means of the method, also bi-polar transistors may be provided in the semiconductor device.

Instead of a semiconductor substrate of monocrystalline silicon, a substrate of another semiconductor material, such as, for example, germanium, or a multilayer substrate of GaAs and AlGaAs may also be used within the scope of the invention.

In the first embodiment described, the cavity formed is filled up completely with insulating material by deposition thereof from the vapour phase. However, it is alternatively possible to oxidize the walls of the cavity in such a manner that the oxide layer formed fills up the cavity completely.

We claim:

1. A method of manufacturing a semiconductor device comprising the steps of
    (a) forming lattice defects in at least one buried zone of a semiconductor substrate of monocrystalline semiconductor material by implanting ions through a main surface of said substrate, said ions being electrically inert relative to said monocrystalline semiconductor material, and said ions introducing said lattice defects into said buried zone to form semiconductor material at said buried zone different than said monocrystalline material,
    (b) selectively etching away said different semiconductor material relative to said monocrystalline material to form a cavity at said buried zone, and
    (c) at least partially filling said cavity with insulating material.

2. A method according to claim 1, wherein said step (b) is carried out at side surfaces of said semiconductor substrate, said cavity opening at said side surfaces.

3. A method according to claim 2, wherein said cavity is completely filled with said insulating material.

4. A method according to claim 1, wherein said step (b) is carried out by the further steps of
    (d) etching an opening to each of said at least one buried zones through said main surface of said substrate, and
    (e) selectively etching away said different semiconductor material through said opening, and
wherein said step (c) is carried out by
    (f) forming a thin dielectric layer of said insulating material over walls of said opening and said cavity, and
    (g) thereafter filling said opening and said cavity with a polycrystalline semiconductor material, said polycrystalline semiconductor material being the same kind as said monocrystalline semiconductor material of said substrate.

5. A method according to claim 4, wherein after step (c) the following stesp are carried out
    (h) etching at least one second opening through said main surface into said substrate to a depth between at least two of said cavities, said second opening having a width extending etween said thin dielectric layer of said two cavities, and
    (i) filling said second opening with said insulating material of said dielectric layer to form a plurality of isolated islands of said monocrystalline material, said isolated islands being fully insulated from said substrate by said dielectric layer and said insulating material.

6. A method according to claim 5, wherein during said step (h) said etching of said second opening extends under said main surface into said substrate to said thin dielectric layer.

7. A method according to claim 4 or 5, wherein said opening is etched anisotropically through said main surface.

8. A method according to claim 4 or claim 5, wherein said thin dielectric layer is formed by exposing said walls of said opening and said cavity to an oxidizing medium.

9. A method according to claim 1 or claim 2 or claim 4 or claim 5, wherein before said step (a) is carried out, said semiconductor substrate is covered with a mask for masking against ion implantation at selected portions of said semiconductor substrate.

10. A method according to claim 1 or claim 2 or claim 4 or claim 5, wherein said semiconductor substrate is formed of silicon, and wherein during said step (a) said ions are selected from Group IV elements.

11. A method according to claim 10, wherein said ions are silicon ions.

12. A method according to claim 1 or claim 2 or claim 4 or claim 5, wherein said step (b) is carried out by one of selective etching with phosphoric acid at a temperature of about 150°–200° C. or of selective etching with a buffered solution of hydrofluoride at room temperature.

13. A method according to claim 1 or claim 2, wherein said step (c) is carried out to completely fill said cavity with said insulating material.

14. A method according to claim 13, wherein said step (c) is carried out by depositing silicon nitride or silicon oxide in said cavity from the vapor phase.

* * * * *